(12) United States Patent
Miki et al.

(10) Patent No.: US 6,630,031 B1
(45) Date of Patent: Oct. 7, 2003

(54) SURFACE PURIFICATION APPARATUS AND SURFACE PURIFICATION METHOD

(75) Inventors: Nobuhiro Miki, Tokyo (JP); Takahisa Nitta, Tokyo (JP)

(73) Assignee: Sipec Corporation, Tokyo (JP)

( * ) Notice: Subject to any disclaimer, the term of this patent is extended or adjusted under 35 U.S.C. 154(b) by 0 days.

(21) Appl. No.: 09/417,009

(22) Filed: Oct. 12, 1999

(30) Foreign Application Priority Data

Aug. 12, 1999 (JP) ............................................. 11-228919
Oct. 12, 1999 (JP) ............................................. 11-290344

(51) Int. Cl.$^7$ ................................................. B08B 7/02
(52) U.S. Cl. ................................. 134/1; 134/2; 134/30; 134/31; 134/66; 134/94.1; 134/95.1; 134/95.3; 134/105; 134/102.1; 134/114; 134/137; 134/198; 134/902; 438/906; 422/186.3; 34/275; 34/276; 34/406; 34/407; 34/409; 34/411; 34/541
(58) Field of Search .......................... 134/1, 2, 30, 95.1, 134/66, 94.1, 105, 114, 95.3, 102.1, 198, 902, 137, 172, 31; 438/906; 34/275, 276, 406, 407, 608, 409, 411, 433, 443, 448, 449, 526, 527, 541, 565, 582, 585; 422/186.3

(56) References Cited

U.S. PATENT DOCUMENTS 4,736,758 A * 4/1988 Kusuhara .................... 134/66
5,326,406 A * 7/1994 Kaneko et al. .................. 134/1
5,503,708 A * 4/1996 Koizumi et al. ............ 156/643.1
5,964,952 A * 10/1999 Kunze-Concewitz ........... 134/2
6,146,469 A * 11/2000 Toshima ....................... 134/37
6,152,153 A * 11/2000 Takase et al. ............... 134/25.4
6,503,464 B1 * 1/2003 Miki et al. ................. 422/186.3

FOREIGN PATENT DOCUMENTS

| JP | 62-1266387 | * | 6/1987 |
| JP | 4-369222 | * | 12/1992 |
| JP | 7-161672 | * | 6/1995 |

* cited by examiner

Primary Examiner—Randy Gulakowski
Assistant Examiner—M. Kornakov
(74) Attorney, Agent, or Firm—Connolly Bove Lodge & Hutz LLP (57) ABSTRACT

By a simple apparatus construction and process, it is made possible to "clean precisely" a surface at the molecular/atomic level, and the purification degree of the surface processed minutely is made into $10^{12}$ molecules/cm$^2$ or less. A steam-spraying nozzle is disposed such that a line slit nozzle is in a diameter direction, and mist-containing steam is sprayed onto the surface of a substrate. Thereby, particles in the steam-spraying surface (the particles were made to adhere by dipping the substrate in a solution containing polystyrene (particle diameter of 0.6 μm) or alumina (particle diameter of 0.3 μm to 0.5 μm) particles at $10^5$ particles/ml.) are removed by about 90% to 95% after ten-seconds spraying, and by 99% or more, that is, to less than the detection limit of a wafer inspection device, after twenty-seconds spraying.

7 Claims, 2 Drawing Sheets

SURFACE PURIFICATION APPARATUS AND SURFACE PURIFICATION METHOD

BACKGROUND OF THE INVENTION

1. Field of the Invention

The present invention relates to a purification technique for process surfaces from substrates to semiconductor devices, surfaces of process apparatus and process apparatus parts, and surfaces of apparatus and apparatus parts in relation to lithographic processes, in manufacturing processes of semiconductor devices and liquid crystal display devices, particularly to an innovative technique for surface purification by "precise cleaning action of steam and ultraviolet rays", and breakaway from a resources/energy high-consumption type technique, that is, a development of an environment-symbiosis type technique which makes dependence upon chemical substances minimum.

2. Description of the Related Art

A very minute process surface cleaning technique in manufacturing a semiconductor device or a liquid crystal display device, depends on a multi-stage process in which a large quantity of ultrapure water and various kinds of chemicals are used in a large-sized apparatus called wet cleaning system. As a technique for renovating this, a cleaning technique using a one-by-one cleaning system is also promoted.

But, these cleaning techniques have not entirely reached the satisfactory level in breakaway from a load of cleaning process and burdens of ultrapure water and chemicals, and following to performance development demand.

In a cleaning technique in a general industrial field, "fluid jet method" is a generally used method. Cleaning—surface-peeling—surface-polishing are possible by a particulate fluid (ice particulates/abrasive particulates) entrained on a jet flow of a high-pressure fluid. It is generally used in case of a large size such as aircraft/vehicles and requiring on-the-spot cleaning. Cleaning methods of spraying steam are also well known, and used for cleaning not only in industrial fields but also in medical/food fields and homes. But, as described later, there is a great difference between the cleaning level in these fields and a required level in a manufacturing field of semiconductor devices or liquid crystal display devices.

Manufacturing process of semiconductor devices/liquid crystal display devices differs from other fields in the feature that it is consistently surface-processing process. It has the technical feature that a surface purification technique affects the performance of products. It is a special field wherein purification levels of all surfaces of not only process surfaces from substrates to semiconductor devices, but also surfaces of process apparatus and process apparatus parts as a matter of course, to surfaces of apparatus and apparatus parts in relation to lithographic processes, become severer with progress of technical generations.

Surfaces to deal with in the present invention are as follows: such as surfaces of silicon substrates/glass substrates/chemical mechanical polishing (CMP) substrates/lithographic process substrates/wiring substrates as process surfaces from substrates to semiconductor devices; such as surfaces of ion-implantation apparatus/plasma apparatus/CVD apparatus and their apparatus parts as surfaces of process apparatus and process apparatus parts; and such as surfaces of stepper devices and mask reticles as surfaces of apparatus and apparatus parts in relation to lithographic processes.

The present inventors perceive the principle of surface purification by steam and ultraviolet rays. And, not "Cleaning" but "Purification" is intended. This is because the purification degree in a general cleaning technique and the purification required degree in a manufacturing field of a semiconductor device or a liquid crystal display device are quiet different in level. Table 1 shows the difference in surface purification degree level.

TABLE 1

Difference in Surface Purification Degree Level

| cleaning level | | |
|---|---|---|
| level ① | 1 to 10 mg/cm$^2$ ($10^{18}$ to $10^{19}$ molecules/cm$^2$) | contaminant-molecular layers on surface of surface roughness of several $\mu$m to scores $\mu$m |
| level ② | 1 to 10 $\mu$g/cm$^2$ ($10^{15}$ to $10^{16}$ molecules/cm$^2$) | monomolecular layer to 10 molecular layers of contaminant molecules |
| cleaning level | | |
| level ③ | 1 to 10 ng/cm$^2$ ($10^{12}$ to $10^{13}$ molecules/cm$^2$) | $10^{-2}$ to $10^{-3}$ molecular layers of contaminant molecules |
| level ④ | 0.1 to 1 pg/cm$^2$ ($10^{8}$ to $10^{9}$ molecules/cm$^2$) | $10^{-6}$ to $10^{-7}$ molecular layers of contaminant molecules |

In general, cleaning is a technique from the level $\hat{1}$ to the level $\hat{2}$. For example, in a metal material surface, the roughness of the mechanical polishing surface is scores $\mu$m, and mechanical processing oil is adhering at a level of several mg/cm$^2$. Even in case that the surface roughness is decreased to about 10 $\mu$m by chemical polishing surface, it is adhering at a level of 1 mg/cm$^2$. The cleaning object is attained when the contamination is removed by about three figures starting from this level $\hat{1}$ to reach the level $\hat{2}$. In a general industrial field, this surface may be considered to be pure.

On the other hand, in semiconductor/liquid crystal industries, the level $\hat{2}$ is the starting point. Present of contaminant molecules in several molecular layers means that molecules/atoms of the substrate are not present in the surface. It defeats its own purpose of making the surface function. Purification is a technique in which the contamination is decreased from the level by about three figures to reach the level $\hat{3}$. Even in this case, a problem may yet remain in the surface operation mechanism in accordance with the kind of contaminant molecules. In the future ultra-LSI generation, the level $\hat{4}$ ($10^{-6}$ to $10^{-7}$ molecular layers) is required which is lower by about four figures than the level $\hat{3}$.

SUMMARY OF THE INVENTION

It is an object of the present invention to provide a surface purification apparatus and a surface purification method capable of "precisely cleaning" a surface into the molecular/atomic level and making the purification degree of the surface $10^{12}$ molecules/cm$^2$ or less, by a new principle and apparatus. In this specification, "Precise Cleaning" of a surface at the molecular/atomic level is expressed by the term of "Purification".

In order to attain the above object, a surface purification apparatus of the present invention is an apparatus used in a manufacturing process of a semiconductor device or a liquid crystal display device, comprising means for bringing steam into contact with and means for spraying steam onto a surface having need of purification, wherein said surface is purified.

In an aspect of the surface purification apparatus of the present invention, said surface is one selected from among process surfaces from a substrate to a semiconductor device, surfaces of process apparatus and process apparatus parts, and surfaces of apparatus and apparatus parts in relation to lithographic processes.

In an aspect of the surface purification apparatus of the present invention, said surface is processed with saturated or superheated steam at a temperature of 70° C. to 200° C.

An aspect of the surface purification apparatus of the present invention, comprises a steam supply apparatus comprising a steam generation system, a steam-superheating system, a control system for supplied ultrapure-water quantity and heat amount, and a steam pressure control system, constructed with including a steam inlet and steam-spraying nozzle, and arbitrarily switching and supplying saturated or superheated steam at a temperature of 70° C. to 200° C.

In an aspect of the surface purification apparatus of the present invention, said steam supply apparatus further includes a switching system for a supply line for a solution containing a purification promotion ingredient and said ultrapure water supply line, and an injection pump, and comprises a system for switching steam containing said purification promotion ingredient and steam not containing it.

An aspect of the surface purification apparatus of the present invention, comprises irradiation means for irradiating with ultraviolet rays, wherein said surface is processed in combination with processing of irradiating said surface with ultraviolet rays in said steam processing.

In an aspect of the surface purification apparatus of the present invention, said irradiation means uses an ultraviolet lamp of a wavelength corresponding to a 50% transmissive distance of not less than 10 mm to steam.

In a surface purification apparatus of the present invention, a system for introducing steam, and a drive system in which a spraying surface is swept by a steam-spraying nozzle moving relatively to a surface being processed, are provided in a chamber including a substrate take in/out system and an atmosphere discharge system, and said steam-spraying nozzle sprays steam onto said surface.

In an aspect of the surface purification apparatus of the present invention, an ultraviolet reactor comprising an ultraviolet lamp of a wavelength corresponding to a 50% transmissive distance of not less than 10 mm to steam, is accompanied, said ultraviolet lamp is disposed in parallel with said surface, and said surface in steam processing is irradiated and processed.

In an aspect of the surface purification apparatus of the present invention, said atmosphere discharge system further comprises a suction system, and the surface being processed is dried by discharging the atmosphere in the chamber after superheated steam processing.

A surface purification method of the present invention is a method used in a manufacturing process of a semiconductor device or a liquid crystal display device, wherein, by using a process for bringing steam into contact with a surface having need of purification, and a process for spraying steam onto the surface having need of purification, said surface is processed.

In an aspect of the surface purification method of the present invention, said surface is one selected from among process surfaces from a substrate to a semiconductor device, surfaces of process apparatus and process apparatus parts, and surfaces of apparatus and apparatus parts in relation to lithographic processes.

In an aspect of the surface purification method of the present invention, said surface is processed with saturated or superheated steam at a temperature of 70° C. to 200° C.

In an aspect of the surface purification method of the present invention, said surface is processed in combination with processing of irradiating said surface with ultraviolet rays of a wavelength corresponding to a 50% transmissive distance of not less than 10 mm to steam, in said steam processing.

In an aspect of the surface purification method of the present invention, organic matters having adhered to said surface are removed by said steam processing and said process of irradiating with ultraviolet rays.

In an aspect of the surface purification method of the present invention, an organic matter film formed on said surface is removed by said steam processing and said process of irradiating with ultraviolet rays.

In an aspect of the surface purification method of the present invention, particles having adhered to said surface are removed by said steam processing and said process of irradiating with ultraviolet rays.

In an aspect of the surface purification method of the present invention, generation of water marks is staved off by discharging the atmosphere in the chamber after superheated steam processing of said surface, and drying the surface being processed.

In an aspect of the surface purification method of the present invention, said surface is a silicon substrate, and said silicon surface is made to be a hydrogen termination structure by steam-processing silicon exposed on said silicon substrate surface.

DETAILED DESCRIPTION OF THE PREFERRED EMBODIMENTS

The present invention uses new measures of "steam processing" and "ultraviolet processing" to the new issue that a surface is "purified" at the molecular/atomic level.

A chemical action of high-temperature steam and a physical action of steam-spraying are used jointly. A characteristic of each of saturated steam and superheated steam is utilized. Further, by superimposing ultraviolet irradiation, a photochemical action at a high temperature is utilized. That is, used is a new measure for purification different in either of mechanism and level from a general steam cleaning.

The present inventors have found the fact that "cleaning at molecular/atomic level" can easily be realized by a physicochemical action of steam at a high temperature and a photochemical action of ultraviolet rays. Hereinafter, the actions of steam and ultraviolet rays will be described in detail.

Besides, a purification apparatus for realizing this new effect and details of a steam supply apparatus and an ultraviolet irradiation apparatus used in this apparatus will be described.

1. Purification Action and Purification Effect of Steam and Ultraviolet Rays Using an example of purification of a silicon substrate surface, the mechanisms of the actions of steam and ultraviolet rays and the discovery of the new effect will be described.

(1) Purification of Organic Matters

Table 2 shows purification test results of oleic acid adhering to silicon wafer surfaces. After saturated steam at 120° C. is sprayed for thirty seconds, oleic acid was purified to monomolecular layer or less.

Here, in case of superimposing ultraviolet irradiation on 120° C. saturated steam processing, it was removed to monomolecular layer ten seconds after, and to less than the detection limit of FTIR measurement twenty seconds after.

reaction. For example, the decomposition rate of oleic acid molecules is 0.05 $\mu g/cm^2 \cdot sec$ at the normal temperature (when the quantum efficiency is 100% in 10 $mW/cm^2$). At a high temperature of 100° C. or more, this effect is further amplified.

The effect of steam/ultraviolet rays superimposition processing as shown in Table 2 is by this photochemical reaction.

TABLE 2

Steam Processing and Steam/Ultraviolet Rays Superimposition Processing of Silicon Wafer Surface-Adhering Oleic Acid

| | before processing | 10 sec processing | 30 sec processing |
|---|---|---|---|
| steam processing [120° C. saturated steam] | | | |
| oleic acid-adhering quantity | 0.2 $mg/cm^2$ | 0.5 $\mu g/cm^2$ | 0.05 $\mu g/cm^2$ |
| (oleic acid molecules) | 4 × $10^{17}/cm^2$ | 1 × $10^{15}/cm^2$ | 1 × $10^{14}/cm^2$ |
| thickness of molecular layer | about 2700 molecular layers on average | about 7 molecular layers on average | monomolecular layer or less |
| steam/ultraviolet rays superimposition processing [120° C. saturated steam] | | | |
| oleic acid-adhering quantity | 0.2 $mg/cm^2$ | 0.1 $\mu g/cm^2$ | <0.005 $ng/cm^2$ |
| (oleic acid molecules) | 4 × $10^{17}/cm^2$ | 2 × $10^{14}/cm^2$ | <1 × $10^{10}/cm^2$ |
| thickness of molecular layer | about 2700 molecular layers on average | almost monomolecular layer on average | less than detection limit | silicon wafer: 4 inches
steam-spraying quantity: 2.55 L/sec,
line slit nozzle: 50 mm × 1.0 mm
ultraviolet irradiation quantity: KrI excimer lamp 10 $mW/cm^2$ (silicon wafer surface)
detection limit of FTIR/ATR: 1 × $10^{12}$ molecules/$cm^2$) detection limit This purification effect is mainly by the following two actions.

Effect of Steam:

Oleic acid is an oily matter having the melting point of 14° C., the boiling point of 233° C., and the viscosity of about 2 centipoise. At 120° C., the vapor pressure of oleic acid rises, and the viscosity decreases to ⅕ or less. A steam-spraying power can easily blow away this liquid from a surface to purify. But, since a monomolecular adsorption layer has an adsorption energy, it is difficult to blow away by a steam-spraying power only.

Although water is known to hydrate in a hydrophobic manner with hydrocarbon to form a cluster, the hydration power of water at a high temperature of 100° C. or more is remarkably great. This hydration power increases the solvent ability remarkably. The mist quantity brought into contact with a monomolecular adsorption layer is about $10^5$ times the oleic acid monomolecular layer every second. It is a sufficient layer for dissolving and removing the oleic acid monomolecular adsorption layer from a surface.

Effect of Ultraviolet Rays:

Ultraviolet rays of a wavelength near 200 nm have an effect of decomposing an organic matter by a photochemical (2) Purification of Particles Table 3 shows purification test results of particles adhering to silicon wafer surfaces. Silicon wafers (diameter of 4 inches) were dipped in solutions containing $10^5$ particles/ml of alumina particles (particle diameter of 0.3 $\mu$m to 0.5 $\mu$m) or polystyrene particles (particle diameter of 0.6 $\mu$m). Steam processing and steam/ultraviolet rays superimposition processing were performed to their surfaces.

Either the alumina particles/polystyrene particles were purified by 20-second processing to less than the detection limit of a wafer inspection device.

In case of polystyrene particles, purification was remarkably shortened by steam/ultraviolet rays superimposition processing. Besides, it was found that superheated steam has a greater purification effect.

As shown in Table 3 and a comparative example, in case of ultraviolet irradiation in air at the normal temperature, the purification effect of polystyrene particles is low. This is because the transmittance of ultraviolet rays of the wavelength of 191 nm in air is not sufficiently great. The 191 nm ultraviolet rays well permeate steam. Here, an advantage of steam atmosphere appears.

TABLE 3

Steam Processing and Steam/Ultraviolet Rays Superimposition Processing of Silicon Wafer Surface-Adhering particles

| | surface-adhering particles | before processing | 10 sec processing | 20 sec processing |
|---|---|---|---|---|
| ① steam processing [120° C. saturated steam] | alumina particles | 4200 particles/wafer | 50 particles/wafer | <1 particle/wafer |
| ② steam processing [120° C. saturated steam] | polystyrene particles | 7000 particles/wafer | 70 particles/wafer | <1 particle/wafer |
| ③ steam/ultraviolet rays superimposition processing [120° C. saturated steam] | polystyrene particles [120° C. saturated steam] | 7000 particles/wafer | 5 particles/wafer | <1 particle/wafer |
| ④ steam/ultraviolet rays superimposition processing [120° C. superheated steam] | polystyrene particles | 7000 particles/wafer | <1 particle/wafer | |
| ⑤ comparison: ultraviolet irradiation in normal-temperature air | polystyrene particles | 7000 particles/wafer | 2500 particles/wafer | 500 particles/wafer | silicon wafer: 4 inches
steam-spraying quantity: 2.55 L/sec,
line slit nozzle: 50 mm × 1.0 mm
ultraviolet irradiation quantity: KrI excimer lamp 10 mW/cm$^2$ (silicon wafer surface)

Effect of Steam:
The effect by using steam is by the following three actions.
1) Collision Force of Mist:
The mist in steam collides against surface-adhering particles at the steam-spraying velocity. The size of mist is about 5 μm to 50 μm in diameter. The collision force by the spraying velocity of about 40 m/sec is sufficient to detach particles of 0.1 μm to several μm from a wafer. Besides, the number of mist colliding every second corresponds to $10^6$ to $10^7$ times the number of surface-adhering particles (about 50 to 100 particles/cm$^2$).

mist quantity colliding surface: 0.015 g/1.5 L·sec
weight of one mist: $2.08 \times 10^{-11}$ g (as a sphere of the diameter of 5 μm) the number of mist colliding surface: about $10^9$ particles/sec 2) Scattering Force of Mist:
A wafer surface has roughness. It has ups and downs in about 0.1 μm figure on a bare silicon surface/oxide film surface, and in several μm or more on a CMP surface or a device surface in accordance with the minute structure mode. A mist collides against these surface ups and downs, and scatters and reflects. The reflected mist collides against side surfaces or adhering points of adhering particles at various angles. This scattering force is effective to detach particles from a surface.

3) Lift-off Effect of High-temperature Mist:
It is well known that lift-off, that is, an action of dissolving a particle adhering point and lifting the particle off a surface is effective to detach the particle from the surface. It is called slide etching, and an infinitesimal amount of solution is enough. Water is said to be the greatest solvent because of its great polarity. In particular, the solvent action of hot water is great, and it produces a sufficient lift-off effect. For example, the solubility of $SiO_2$ to water at 100° C. is about 100 times that at the normal temperature (the solubility of $SiO_2$ to water: 0.013% (20° C.), 1.4% (100° C.)).

A silicon wafer surface is a natural oxide film $SiO_2$ in general. Besides, various surface structures are constructed on thermal oxidation film $SiO_2$ base. Even in a metal structure surface, the metal surface is naturally oxidized to form an oxide film. On these surfaces, the solvency of hot water acts.

For the above reasons, the solvency of high-temperature mist becomes a strong lift-off effect.

Effect of Ultraviolet Rays:
The effect of ultraviolet rays is by the following action.
Ultraviolet Decomposition of Organic Polymer Particle:
It was described before that ultraviolet rays decompose oleic acid molecules at a rate of 0.05 μg/cm$^2$·sec at the normal temperature (when the quantum efficiency is 100% in 10 mW/cm$^2$). Also in relation to polystyrene particles, the photochemical equivalent is almost the same. Since the used ultraviolet light quantity (10 mW/cm$^2$) is about $10^6$ times the polystyrene molecule reaction equivalent every second, it is a light quantity enough for purification.

polystyrene particle (0.6 μm) 7000 particles/4-inch wafer= polystyrene molecule $1 \times 10^{-5}$/cm$^2$ In many cases, the particle contaminant sources in semiconductor/liquid crystal processes are organic high-molecule materials. This is because many organic high-molecule materials are used in containers, pipes, structural materials, and component parts. Cleaning process is also not exceptional. For this reason, particle contamination of unknown origin may be pretty sure to be considered organic high molecules. Ultraviolet processing is the most suitable for purification of such organic matter particles.

(3) Removal of Organic Film

In semiconductor/liquid crystal-manufacturing, lithographic process is so important that it should be considered a key process. In lithographic process, there is a process in which an organic high-molecule film called resist film is used, and the film is removed after performing light irradiation, development, and etching. In general, oxygen plasma ashing process is used. A new technique has been looked for to replace this ashing process, which requires a long time and produces a large amount of contamination.

Steam/ultraviolet processing can easily remove this organic high-molecule film. It is by the principle that an organic high-molecule film is changed by steam, and the boundary layer between the film and a surface is changed by ultraviolet rays. Since it is not decomposed but peeled off, short-time processing is possible. There is no problem of contamination attendant upon the ashing process.

Details of this technique will be described in the below examples.

2. Surface Effect of Steam

Some characteristic surface effects have been found.

(1) Water Mark Effect

As a problem on the final finishing when a substrate surface is purified, the solution of water mark is a difficult problem. Even if cleaning is finished with ultrapure water, a waterdrop remaining on the surface generates a water mark to be obstacle to a minute circuit construction. It is considered that a process of drying with the waterdrop dissolving a very small amount of the surface is the cause of the generation. Superheated steam processing completely settles this problem. Since superheated steam contains no mist, there is no water mark generation source. It is the most suitable processing for final finishing—drying.

(2) Hydrogen Termination Effect

A problem on the final finishing when a silicon surface is purified, is to change terminal groups of silicon atoms arranged in the surface into hydrogen. A surface which has become bare silicon by hydrofluoric processing, shows a peak of Si—OH alongside Si—H in an FTIR-ATR spectrum, for example. For making complete hydrogen terminal groups, hydrogen annealing in a hydrogen atmosphere is being studied. The present inventors have found that steam processing is effective for hydrogen termination. This is supposed to be the effect of a chemical action of hot water as exemplified below.

reaction of water at 100° C. and sulfur:

$2H_2O+3S=SO_2+2H_2S$

3. Steam Supply Apparatus

Figure 1:
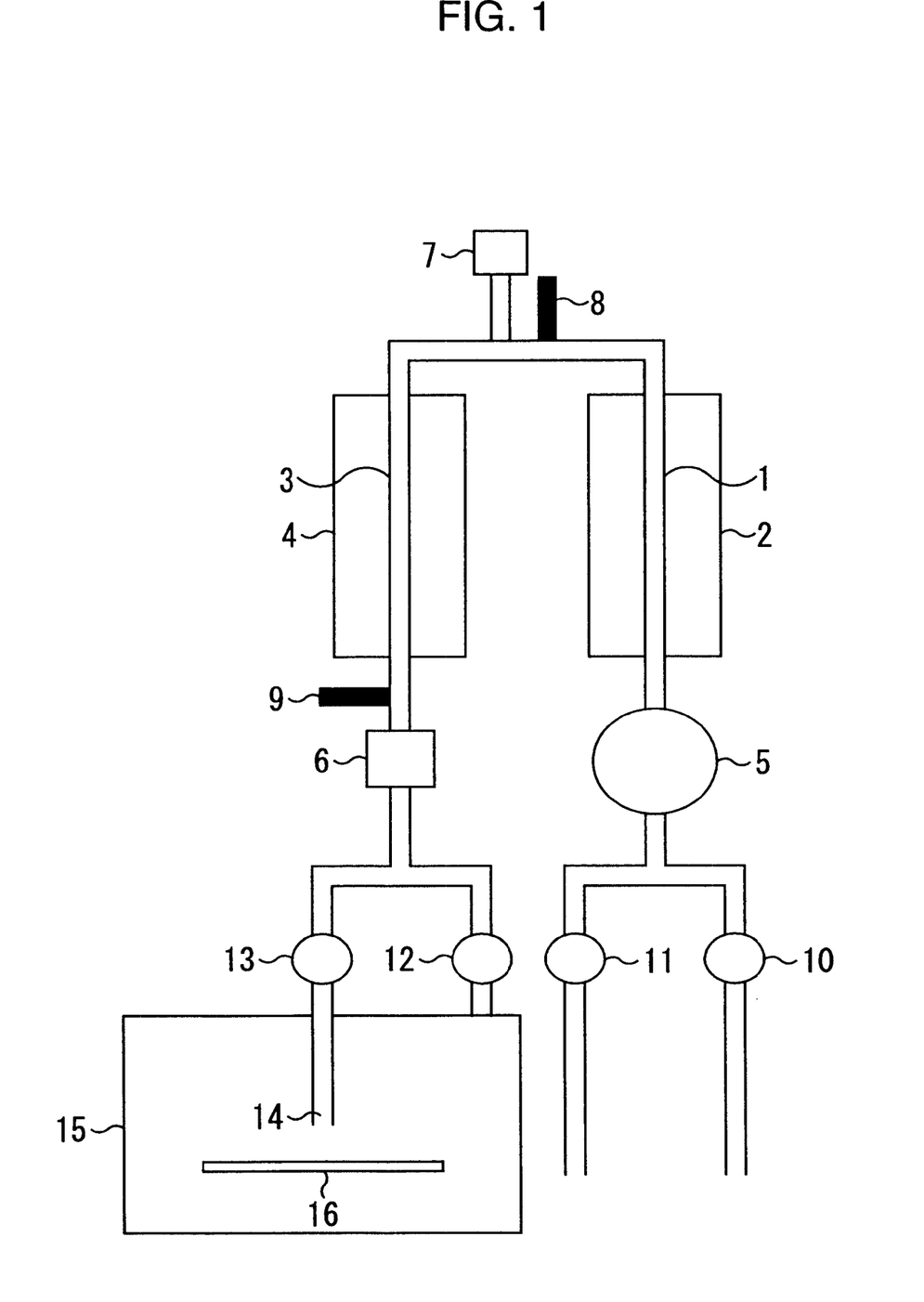
FIG. 1 is a typical view showing the principal construction of a steam supply apparatus of an embodiment of the present invention.

FIG. 1 exemplifies a fundamental view of a steam supply apparatus. An evaporator 1 and a heating block 2 for generating saturated steam, and a superheater 3 and a heating block 4 for generating superheated steam, are disposed between a constant flow pump 5 and a pressure control needle valve 6. The internal pressure of this steam generation system is measured with a pressure gauge 7. The temperatures of saturated and superheated steams are measured with thermometers 8 and 9. The heating area in the evaporator 1 is so designed as to satisfy the burnout point condition of a boiling characteristic curve.

Switching Steam of Pure Water and Steam Containing Promotion Ingredient:

When steam of ultrapure water is generated, a valve 10 for an ultrapure water line is opened. When steam containing a promotion ingredient is generated, a valve 11 for an aqueous solution line is opened.

Switching Saturated and Superheated Steams:

When saturated steam is supplied, the heating block 4 for superheating is not supplied with heat. At this time, the superheater 3 merely functions as a passage for steam. When superheated steam is supplied, the heating block 4 for superheating is supplied with heat to perform superheating by the superheater 3.

Switching Steam-contact and Steam-spraying:

When steam is introduced into a processing chamber 15, an introduction valve 12 is opened. When steam is sprayed onto a surface to be processed, a steam-spraying valve 13 is opened and steam is sprayed onto the surface 16 to be processed, through a steam-spraying nozzle 14.

Table 4 exemplifies control conditions for steam supply. Table 5 exemplifies conditions of the water-spraying nozzle. The nozzle shape/steam quantity/spraying velocity are arbitrarily designed so as to meet the purpose.

TABLE 4

Control Condition for Steam Supply

| water supply | | saturated steam generation conditions | | | superheated steam generation conditions | | |
|---|---|---|---|---|---|---|---|
| quantity and heat quantity | | internal pressure | temperature | steam quantity | internal pressure | temperature | steam quantity |
| ml/sec | KWH | Kg/cm² | ° C. | L/sec | Kg/cm² | ° C. | L/sec |
| 1.5 | 3.9 | 1.0 | 100 | 2.55 | — | — | — |
| 1.5 | 3.9 | 2.0 | 120 | 2.69 | 1.00 | 120 | 2.69 |
| 1.5 | 4.0 | 3.6 | 140 | 2.83 | 1.00 | 140 | 2.83 |
| 1.5 | 4.0 | 6.0 | 160 | 2.96 | 1.00 | 160 | 2.96 | water supply quantity temperature: 20° C.;
quantity of heat: net value (except radiation loss)
saturated steam: exemplified are only cases of 100 to 160° C.
superheated steam: exemplified are only cases of 100° C. saturated superheated steam generation

TABLE 5

Condition Example of Steam-spraying Nozzle

| steam quantity L/sec | point nozzle | | line slit nozzle | |
|---|---|---|---|---|
| | nozzle shape | steam-spraying linear velocity m/sec | nozzle shape | steam-spraying linear velocity m/sec |
| 2.55 | inside diameter of 5 mm | 120 | 200 mm × 0.5 mm | 52 |
| 2.55 | inside diameter of 10 mm | 32 | 200 mm × 1.0 mm | 13 |
| 2.55 | | | 50 mm × 1.0 mm | 52 |

4. Ultraviolet Reactor

Selections of the ultraviolet wavelength and time characteristics of a lamp used in an ultraviolet reactor are important technical factors.

Selection of Ultraviolet Wavelength:

The shorter the ultraviolet wavelength is, the greater the energy is and the lower the transmissivity to the irradiation atmosphere is. The ultraviolet wavelength must be so selected as to satisfy the transmissivity.

Table 6 shows relations between ultraviolet wavelengths and 50% transmissive distances to air, water, and steam. It is found that ultraviolet wavelengths whose 50% transmissive distances are 10 mm or more in steam atmosphere, are 185 nm or more.

A relation between the light absorption sectional area of molecules present in the atmosphere and the light transmissivity, is given by expression (1). Logarithms of the transmissivity become proportional to distances. The present inventors use 50% transmissive distance as an index. This 50% transmissive distance is given by expression (2). Table 1 shows relations between ultraviolet wavelengths and 50% transmissive distances to air, water, and steam obtained by expression (2) or actual measurements. For example, the 50% transmissive distance of ultraviolet rays of the wavelength of 172 nm to air is obtained as 3.1 mm from the light absorption sectional area of oxygen ($0.259 \times 10^{-19}$ molecules/cm$^2$) while the actual measurement of 2.2 mm is obtained. Both are almost equal.

$$\delta CL = \ln(I^0/I) \quad (1)$$

$\delta$: light absorption sectional area (molecules/cm$^2$), $O_2$... $0.259 \times 10^{-19}$ C: molecule concentration (partial pressure of molecule)

L: transmissive distance (cm)

$I^0/I$: light transmissivity=incident light intensity/transmitted light intensity  (2)

$$\delta CL_{50} = \ln(100/50)$$

$L_{50}$: 50% transmissive distance

TABLE 6

Ultraviolet Wavelength and 50% Transmissive distances to Air/Water/Steam

| | | | 50% transmissive distance | | |
|---|---|---|---|---|---|
| excimer ultraviolet lamp | wavelength nm | energy eV | air mm | water mm | steam mm |
| Xe excimer lamp | 172 | 7.21 | 3 | | |
| ArCl excimer lamp | 175 | 7.08 | 6 | <10 | <10 |
| | 185 | 6.70 | 40 | 10 | >1 × 10$^4$ |
| KrI excimer lamp | 191 | 6.49 | 100 | 28 | |
| ArF excimer lamp | 193 | 6.42 | >100 | 42 | |
| XrBr excimer lamp | 207 | 5.99 | >100 | | |
| KrCl excimer lamp | 222 | 5.58 | | | |
| low-pressure mercury lamp | 185 · 254 | | | | |
| i-line lamp | 365 | 3.41 | | | |

Selection of Time Response:

An ultraviolet lamp is selected in accordance with which of a moment type and a constant type ultraviolet processing is performed in.

An ultraviolet excimer lamp can be used in a moment-type process. It reaches its stationary state in several seconds after being lit.

It is suitable for a sequential process by unit time of second in one-by-one ultraviolet processing. A low-pressure mercury lamp, an i-line lamp, or the like can be used in a constant-type process. Although they require scores minutes for reaching their stationary states after being lit, they are stable after then.

5. One-by-one Surface Purification Apparatus

A one-by-one surface purification apparatus has a drive system in which a spraying surface is swept by a substrate surface and a steam-spraying nozzle moving relatively, in a chamber comprising a substrate take-in/out system/an atmosphere purge system/a liquid discharge system, and constructed by disposing a point nozzle or a line slit nozzle.

Figure 2:
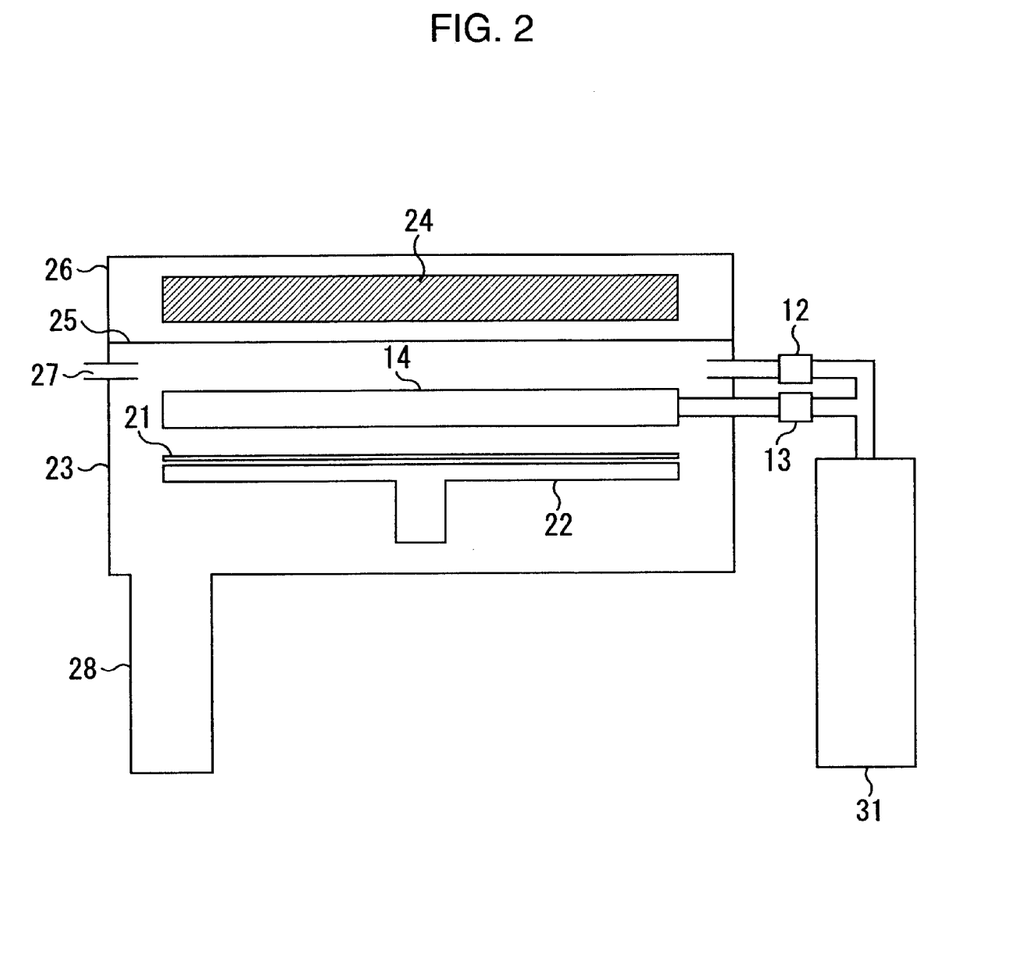
FIG. 2 is a typical view showing the principal construction of a surface purification apparatus of an embodiment of the present invention.

FIG. 2 exemplifies a one-by-one surface purification apparatus having a spin rotation system.

This surface purification apparatus comprises a steam-processing chamber 23 provided with a spin rotation system 22 for rotating a substrate 21, and a lamp chamber 26 including an ultraviolet lamp 24 and having a quartz window board 25. A gas inlet 27 to the chamber and a discharge duct 28 are accompanied.

When steam is introduced into the processing chamber from the steam supply apparatus 31 shown in FIG. 1, the steam introduction valve 12 is opened. When steam is sprayed onto a surface to be processed, the steam-spraying valve 13 is opened and steam is sprayed onto the surface of the substrate 21 through the steam-spraying nozzle 14.

Shown is an example of the steam-spraying nozzle 14 in which a line slit nozzle is disposed in a diameter direction. It may be a system in which a spot nozzle is driven radially, or several nozzles are moved in a proper distance or fixed. The spraying angle and spraying distance of the nozzle and the linear velocity of sprayed steam are optimized in various respects, such as the object of processing/the surface structure of the substrate/protection for damage.

The steam-processing chamber 23 is kept in temperature. Steam is condensed little by little on the inner wall of the chamber. It serves to clean the inner wall. In this manner, the interior of the chamber is always kept clean.

The gas inlet 27 to the chamber is used for changing the atmosphere when a substrate is taken in/out. It is used also for adding an effective ingredient for processing to the atmosphere. The discharge duct 28 preferably has a cooling structure.

Hereinafter, effects of a new purification process in which a steam processing apparatus and an ultraviolet processing apparatus are combined, will be described in detail with reference to examples.

EXAMPLE 1

Silicon substrate purification was performed using a one-by-one surface purification apparatus and an ultraviolet processing apparatus.

In purification step 1, purification of organic matter/particle was performed by fluoric acid/hydrogen peroxide-containing steam processing under KrI excimer ultraviolet irradiation. In purification step 2, fluoric acid-containing steam processing was performed under KrI excimer ultraviolet irradiation. In purification step 3, drying was performed by superheated steam processing.

Table 7 shows the purification results. Organic matters, metal, particles, and water marks were purified to less than their detection limits.

Besides, as for silicon substrate surfaces, the peak ratios of Si—O/Si—H, which appear in FTIR-ATR spectrum, were 0.05 or less. In case of a conventional wet cleaning, the peak ratio of Si—OH/Si—H is 0.1 to 0.5, and the hydrogen termination effect of steam processing is confirmed.

TABLE 7

Silicon Substrate Purification Result

| | | processed surface | |
|---|---|---|---|
| processing condition | | silicon | silicon thermal oxidation film |
| processing [detail of steam] | steam temperature °C. | processing time sec | processing time sec |
| step 1 | | | |
| steam/ ultraviolet rays superimposition processing [steam containing promotion ingredient A] | 100 | 15 | 15 |
| step 2 | | | |
| steam/ ultraviolet rays superimposition processing [steam containing promotion ingredient B] | 100 | 15 | 15 |
| step 3 | | | |
| drying [superheated steam] | 120 | 15 | 15 |

TABLE 7-continued

Silicon Substrate Purification Result

| | | processed surface | |
|---|---|---|---|
| processing condition | | silicon | silicon thermal oxidation film |
| processing [detail of steam] | steam temperature °C. | processing time sec | processing time sec |
| processing result | | | |
| organic matter concentration | molecules/cm$^2$ | less than detection limit | less than detection limit |
| metal impurity concentration | atoms/cm$^2$ | less than detection limit | less than detection limit |
| number of particles | particles/ wafer | 5 or less | 5 or less |
| water marks | marks/wafer | 1 or less | 1 or less | substrate size: 8 inches
steam-spraying quantity: 2.55 L/sec,
line slit nozzle: 100 mm × 1.0 mm
ultraviolet irradiation quantity: KrI excimer lamp 10 mW/cm$^2$ (silicon wafer surface)
promotion ingredient solution A: fluoric acid/hydrogen peroxide (HF0.5%/ H$_2$O$_2$0.5%)
promotion ingredient solution B: diluted fluoric acid (HF0.2%)
detection limit of organic matters: in FTIR/ATR (1 × 10$^{12}$ molecules/cm$^2$)
detection limit of metal: chemical analysis (1 × 10$^{10}$ atoms/cm$^2$)
detection limit of particles: in wafer inspection device (particles/water marks of 0.1 μm or more)

EXAMPLE 2

Purification of surfaces of masks for semiconductor/liquid crystal manufacturing (for lithography) was performed.

Glass Substrate Purification:

In step 1, alkali and a surface active agent were used as purification promotion ingredients. Lift-off effect of particles by slide etching of glass surfaces and slide etching promotion effect by alkali were superimposed, and all the alien substances on the glass surfaces were purified. Organic matters were purified by hot steam.

In step 2, surface active agent adsorption layers at monomolecular layer level on surfaces were purified.

In step 3, pure dried surfaces were obtained by superheating.

Blanks Purification:

Because chromic oxide forming a surface layer of a chromic oxide film has a non-stoichiometric composition, it is etched by hot steam. Accordingly, step 1 was omitted, and surfaces were slide-etched by pure-water steam-spraying by step 2, and all the contamination in sputtering process could be purified.

Mask Purification:

By purification by step 2 only, adhering of etching liquid components (e.g., ceric salt solution) in wet-etching process could be purified. By superimposition of ultraviolet processing, resist residue in resist-peeling step could be purified.

TABLE 8

Photomask Purification Result

| processing [detail of steam] | processing condition steam temperature °C. | processed surface glass substrate processing time | blanks processing time | masks processing time |
|---|---|---|---|---|
| step 1 | | | | |
| steam processing [steam containing promotion ingredient] | 100 | 30 sec | — | — |
| step 2 | | | | |
| steam/ ultraviolet rays superimposition processing [saturated steam] | 100 | 15 sec | 15 to 30 sec | 15 to 30 sec |
| step 3 | | | | |
| drying [superheated steam] | 120 | 15 to 30 sec | 15 to 30 sec | 15 to 30 sec |
| processing result | | | | |
| organic matter | | not detected | not detected | not detected |
| metal impurity | | not detected | not detected | not detected |
| particles | | 1 or less | 1 or less | 1 or less | steam-spraying quantity: 2.55 L/sec,
line slit nozzle: 50 mm × 1.0 mm
ultraviolet irradiation quantity: KrI excimer lamp 10 mW/cm² (surface to be processed)
promotion ingredient solution: alkali/surface active agent

EXAMPLE 3

Purification of chemical mechanical polishing (CMP) surfaces was performed.

Used was the one-by-one minute processing surface purification apparatus having the spin rotation system shown in FIG. 1. The mist-containing steam generation apparatus is a switching type between purification promotion ingredient-containing mist generation and pure-water mist generation, like example 1. The line slit nozzle and mist-containing steam-spraying conditions shown in Table 5 were used. Table 9 shows the processing steps, processing details, and processing times.

TABLE 9

Surface Purification Result after CMP

| step | processing [detail of steam] | oxide film CMP surface alkaline silica slurry polishing | Al-wiring CMP surface acid alumina slurry polishing | Cu-wiring CMP surface acid alumina slurry polishing iron oxide salt mixed |
|---|---|---|---|---|
| step 1 | steam/ultraviolet processing [steam containing promotion ingredient] | 1 min | 1 min | 1 min |
| step 2 | steam/ultraviolet processing [saturated steam] | 15 to 30 sec | 15 to 30 sec | 15 to 30 sec |
| step 3 | drying processing [superheated steam] | 15 to 30 sec | 15 to 30 sec | 15 to 30 sec | steam-spraying quantity: 2.55 L/sec,
line slit nozzle: 50 mm × 1.0 mm
steam temperature: 100 to 140° C., selected in accordance with polishing slurry
ultraviolet irradiation quantity: low-pressure mercury lamp 10 mW/cm² (surface to be processed)
promotion ingredient solution: acid or alkali/surface active agent, selected in accordance with polishing slurry Oxide Film CMP Surface:

After alkaline silica slurry polishing, steam processing of step 1 was directly performed not through scrubber processing using brush. For purification promotion, an HF-surface active agent was used.

After step 1, slurry particles are not measured on surfaces. After step 2, surface active agents are not detected on surfaces.

Al-wiring CMP Surface:

Performed was the same processing as the oxide film CMP surface processing except using an alkaline-surface active agent as a purification promotion solution. It is direct processing not through scrubber processing. After step 1, alumina slurry particles do not remain on surfaces. This is by the spraying power of steam, the effect of the promotion agent, that is, slide-etching effect on the oxide film surface, and the zeta-potential effect of oxide film/alumina slurry particle of the surface active agent. After step 2, surface active agents are not detected on surfaces.

Cu-wiring CMP surface:

Performed was quite the same processing as Al-wiring CMP surface processing. Similarly, by the spraying power of steam, the slide-etching effect, and the zeta-potential effect of the surface active agent, completely pure surfaces were obtained.

EXAMPLE 4

Shown are examples of excimer ultraviolet processing apparatus in which resist films are peeled off by steam/ultraviolet rays superimposition processing.

Shown are examples of steam/ultraviolet rays superimposition processing to ion-implanted resist films, which are hard to peel off. Sample: silicon thermal oxidation film etched surface, ion-implantation to the lower-layer silicon substrate.

Ion-implantation conditions: acceleration energy of 80 keV. dose amount of phosphorus of $6 \times 10^{15}/cm^2$.

Ultraviolet lamp: KrI excimer lamp, wavelength; 191 nm.

Ultraviolet irradiation quantity: 10 mW/cm² (surface to be processed).

Table 10 shows the peeling-off results.

After saturated steam processing at 100° C. and ultraviolet irradiation processing for two minutes of the condition 1, the resist film could be removed by spraying process for one minute.

After saturated steam processing at 120° C. and ultraviolet irradiation processing for thirty seconds of the condition 2, the resist film could be removed by spraying process for thirty seconds.

TABLE 10

Effect of Ultraviolet Irradiation Superimposition for Ion-implanted Resist Removal

| processing step | first step steam-containing process ultraviolet irradiation superimposition | second step steam-spraying process | resist removal state |
|---|---|---|---|
| condition 1 | | | |
| kind of steam | saturated steam | saturated steam | removed in processing time of 3 min |
| temperature of steam | 100° C. | 100° C. | |
| processing time | 2 min | 1 min | |
| condition 2 | | | |
| kind of steam | saturated steam | superheated steam | removed in processing time of 1 min |
| temperature of steam | 120° C. | 130° C. | |
| processing time | 30 sec | 30 sec | |

According to the present invention, it becomes possible to "clean precisely" a surface at the molecular/atomic level by a simple apparatus construction and a process. Concretely, it is realized to make the purification degree of a surface minutely processed, $10^{12}$ molecules/cm$^2$ or less.

What is claimed is:

1. A one-by-one surface purification apparatus used in a manufacturing process of semiconductor devices or liquid crystal display devices, wherein substrates to be purified are set one-by-one, said apparatus comprising:
   means for generating saturated steam;
   means for generating superheated steam;
   means for bringing at least one of said saturated steam and said superheated steam into contact with a surface of each of said substrates;
   means for spraying at least one of said saturated steam and said superheated steam onto said surface; and
   means for irradiating with ultraviolet rays, wherein said surface is processed in combination with processing of irradiating said surface with ultraviolet rays in said steam processing, and
   wherein at least one of saturated steam and superheated steam is selectively used to purify said surface.

2. A surface purification apparatus described in claim 1, wherein said irradiation means uses an ultraviolet lamp of a wavelength corresponding to a 50% transmissive distance of not less than 10 mm to steam.

3. A one-by-one surface purification apparatus used in a manufacturing process of semiconductor devices or liquid crystal display devices, wherein substrates to be purified are set one-by-one, said apparatus comprising:
   means for generating saturated steam;
   means for generating superheated steam;
   means for bringing at least one of said saturated steam and said superheated steam into contact with a surface of each of said substrates;
   means for spraying at least one of said saturated steam and said superheated steam onto said surface; and
   an ultraviolet reactor, said reactor comprising an ultraviolet lamp of a wavelength corresponding to a 50% transmissive distance of not less than 10 mm to steam, said ultraviolet lamp being disposed in parallel with said surface having need of purification, wherein said surface in steam processing is irradiated and processed with said ultraviolet lamp,
   wherein at least one of saturated steam and superheated steam is selectively used to purify said surface.

4. A one-by-one surface purification method used in a manufacturing process of semiconductor devices or liquid crystal display devices, wherein substrates to be purified are set one by one, said method comprising the steps of:
   generating saturated steam;
   generating superheated steam;
   bringing at least one of said saturated steam and said superheated steam into contact with a surface of each of said substrates; and
   spraying at least one of said saturated steam and said superheated steam onto said surface,
   wherein said surface is processed in combination with processing of irradiating said surface with ultraviolet rays of a wavelength corresponding to a 50% transmissive distance of not less than 10 mm to steam, in said steam processing; and
   wherein at least one of said saturated steam and superheated steam is used as said steam to purify said surface.

5. A surface purification method described in claim 4, wherein organic matters having adhered to said surface are removed by said steam processing and said process of irradiating with ultraviolet rays.

6. A surface purification method described in claim 4, wherein an organic matter film is formed on said surface and is removed by said steam processing and said process of irradiating with ultraviolet rays.

7. A surface purification method described in claim 4, wherein particles having adhered to said surface are removed by said steam processing and said process of irradiating with ultraviolet rays.

\* \* \* \* \*